US010026436B2

(12) United States Patent
Foote et al.

(10) Patent No.: US 10,026,436 B2
(45) Date of Patent: Jul. 17, 2018

(54) APPARATUS AND METHODS FOR SUPPORTING WORKPIECES DURING PLASMA PROCESSING

(75) Inventors: David K. Foote, San Jose, CA (US); James D. Getty, Vacaville, CA (US)

(73) Assignee: Nordson Corporation, Westlake, OH (US)

( * ) Notice: Subject to any disclaimer, the term of this patent is extended or adjusted under 35 U.S.C. 154(b) by 509 days.

(21) Appl. No.: 12/496,369

(22) Filed: Jul. 1, 2009

(65) Prior Publication Data
US 2011/0000882 A1    Jan. 6, 2011

(51) Int. Cl.
C23F 1/00      (2006.01)
H01J 37/32     (2006.01)
G11B 5/855     (2006.01)

(52) U.S. Cl.
CPC ........ G11B 5/855 (2013.01); H01J 37/32431 (2013.01)

(58) Field of Classification Search
CPC .............................................. H01L 21/68735
USPC ................ 118/728–732; 156/345.51–345.55; 204/298.15
See application file for complete search history.

(56) References Cited

U.S. PATENT DOCUMENTS

| 3,469,686 | A | * | 9/1969 | Gutsche et al. | 206/712 |
| 4,735,701 | A | * | 4/1988 | Allen et al. | 204/298.15 |
| 4,944,246 | A | * | 7/1990 | Tanaka et al. | 118/729 |
| 5,814,196 | A | * | 9/1998 | Hollars et al. | 204/298.15 |
| 6,316,361 | B1 | * | 11/2001 | Hansson | C23C 16/481 |
| | | | | | 117/88 |
| 6,805,054 | B1 | | 10/2004 | Meissl et al. | |
| 6,900,881 | B2 | | 5/2005 | Sreenivasan et al. | |
| 7,235,139 | B2 | * | 6/2007 | Boguslavskiy et al. | 118/728 |
| 7,547,504 | B2 | | 6/2009 | Sreenivasan | |
| 2002/0083899 | A1 | * | 7/2002 | Komeno | C23C 16/4581 |
| | | | | | 118/730 |
| 2006/0068084 | A1 | * | 3/2006 | Shinozaki et al. | 427/64 |
| 2007/0241454 | A1 | * | 10/2007 | Chen et al. | 257/724 |

(Continued)

FOREIGN PATENT DOCUMENTS

| JP | 62-240879 | 10/1987 |
| JP | 63-287933 | 11/1988 |

(Continued)

OTHER PUBLICATIONS

Chou, et al, "Sub-10 nm imprint lithography and applications", J. Vac. Sci. Technol. B 15(6), Nov./Dec. 1997, pp. 2897-2904.
McClelland, et al, "Nanoscale patterning of magnetic islands by imprint lithography using a flexible mold", Applied Physics Letters, vol. 81, No. 8, Aug. 19, 2002, pp. 1483-1485.
The State Intellectual Property Office of the People's Republic of China, First Office Action received in application No. 201010221024.1 dated Mar. 4, 2014.

(Continued)

Primary Examiner — Karla A Moore
Assistant Examiner — Tiffany Z Nuckols
(74) Attorney, Agent, or Firm — Baker & Hostetler LLP

(57) ABSTRACT

Apparatus and methods for simultaneously supporting multiple workpieces inside a processing space of a plasma processing system for simultaneous two-sided plasma processing. The apparatus may be a fixture having a carrier plate configured to be supported inside the processing space and a plurality of first openings extending through the thickness of the carrier plate. The carrier plate is configured to contact each of the workpieces over an annular region at an outer peripheral edge so that the first and second sides of each of the workpieces is exposed to the plasma through a respective one of said plurality of first openings.

9 Claims, 6 Drawing Sheets

(56) References Cited

U.S. PATENT DOCUMENTS

2008/0069951 A1* 3/2008 Chacin .............. C23C 16/45521
                                                       427/248.1
2008/0149590 A1* 6/2008 Maeda .................. B82Y 10/00
                                                       216/22
2009/0255901 A1* 10/2009 Okita et al. ..................... 216/67

FOREIGN PATENT DOCUMENTS

| JP | H04173974 A | 6/1992 |
| JP | H06116760 A | 4/1994 |
| JP | H06122667 A | 5/1994 |
| JP | H10324980 A | 12/1998 |
| JP | 2009116927 A | 5/2009 |
| WO | WO 2007043528 A1 * | 4/2007 |

OTHER PUBLICATIONS

The State Intellectual Property Office of the People's Republic of China, Second Office Action issued in application No. 201010221024.1 dated Oct. 8, 2014.

Japan Patent Office, Official Action issued in Patent Application No. 2010-151009 dated Jun. 17, 2014.

Intellectual Property Office of Singapore, Written Opinion issued in Patent Application No. 2012093902 dated Dec. 8, 2014.

The Korean Intellectual Property Office, Notice of Preliminary Rejection received in application No. 10-2010-0062506 dated Sep. 30, 2016.

\* cited by examiner

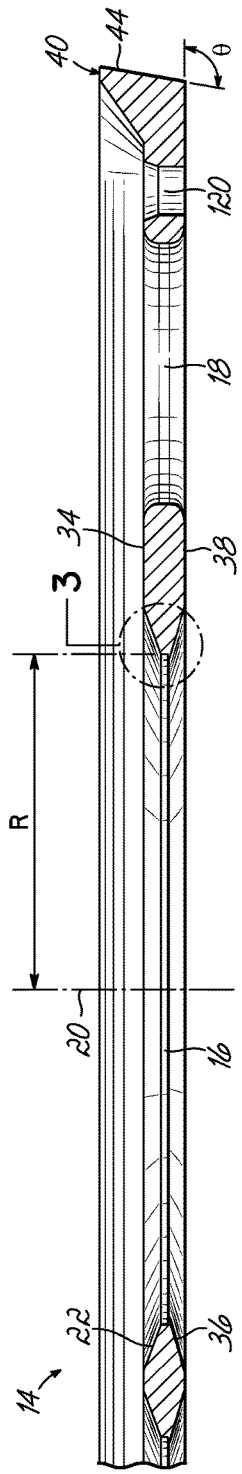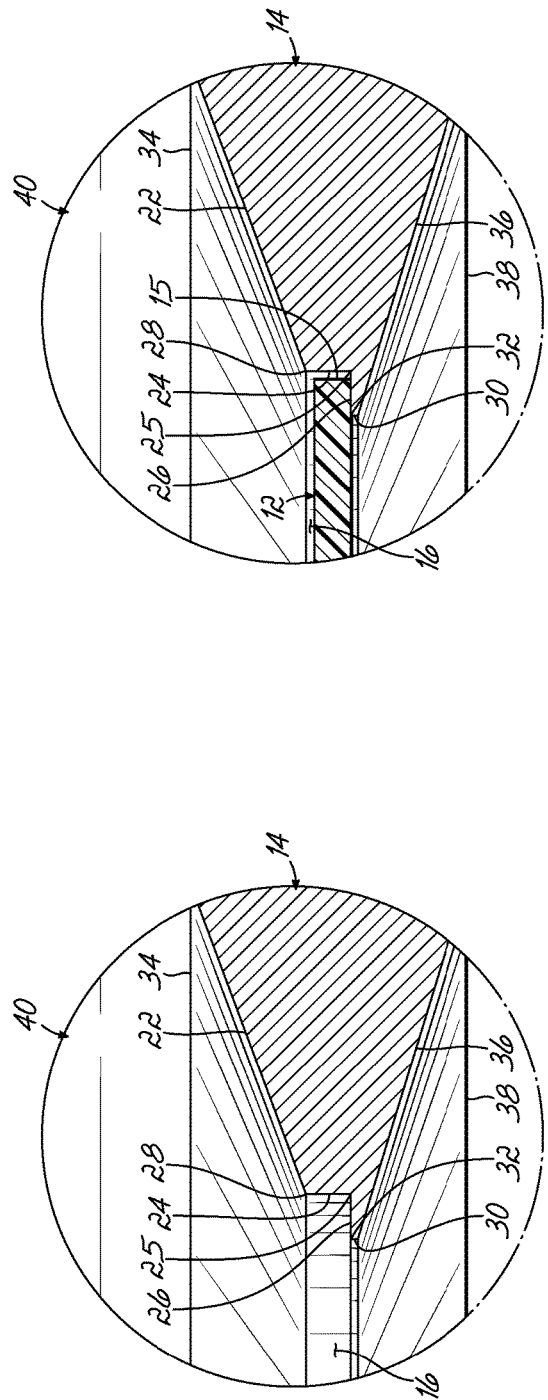

APPARATUS AND METHODS FOR SUPPORTING WORKPIECES DURING PLASMA PROCESSING

BACKGROUND

The invention generally relates to apparatus and methods for processing multiple workpieces with plasma.

Disk drives are widely used in various applications, particularly in the computer industry. In particular, disk drives are used to store large amounts of data/information in magnetizable form on a platter. The platter is supported on a motor-driven spindle and spun by the hard disk drive. Data/information is written to magnetic media on the platter using one or more write heads and is read from the magnetic media using one or more read heads.

Each write head applies a magnetic field that selectively magnetizes regions of a thin film of magnetizable material in the magnetic media deposited on the platter. Typically, the platters are made from a non-magnetic material, such as an aluminum alloy or glass, and the magnetic media is deposited on both sides of the platter. After the magnetic field produced by the write head is removed, the magnetic media in the various regions of the platter retains the magnetization. The direction of the magnetization matches the direction of the applied magnetic field, which permits non-volatile storage of the digitally written data/information in a binary format. The pattern of magnetization embedded in the magnetic media on the platter can subsequently produce an electrical response in the read head, which permits the stored data/information to be read.

Patterned magnetic recording media is being considered as a promising approach for increasing the storage density of a disk drive platter. Discrete track recording (DTR) and bit patterned media (BPM) are two specific patterning techniques capable of boosting capacity beyond current levels. A relatively new process that is amenable for use in patterning magnetic recording media is imprint lithography, which is not limited by the constraints of photolithography.

Imprint lithography relies on a master template to imprint a pattern in a liquid resist dispensed onto the magnetic recording media and then photocures the patterned liquid resist with radiation transferred through the master template. After the template is removed, the photocured pattern of resist forms an etch mask that is a replica of the pattern on the master template. The etch mask includes thick regions and relatively thin regions modulated as a mirror image of the pattern of raised and recessed features on the master template. Resist in the thin regions is removed using an anisotropic dry etching process, such as reactive ion etching. Because of the thickness difference, resist remains in the relatively thick regions of the etch mask after the thin regions are removed. Dry etching is continued with a different etch recipe to transfer the pattern from the etch mask to the underlying layer.

Efficient, cost-effective methods and apparatus are desired for removing the cured resist material from the thinned regions of the patterned mask.

SUMMARY

In one embodiment, an apparatus is provided for use in supporting a plurality of workpieces inside a processing space for simultaneously dry etching first and second sides of the workpieces with a plasma. The apparatus includes a fixture including a carrier plate configured to be supported inside the processing space and a plurality of first openings extending through the thickness of the carrier plate. The carrier plate is configured to contact each of the workpieces over an annular region at an outer peripheral edge so that a respective one of the plurality of first openings exposes the first and second sides of each of the workpieces to the plasma.

In another embodiment, an apparatus is provided for use in supporting a plurality of workpieces inside a processing space for simultaneously dry etching first and second sides of the workpieces with a plasma. The apparatus includes a fixture with a carrier plate configured to be supported inside the processing space and a plurality of posts that project outwardly from the carrier plate. Each of the posts includes a first section attached to the carrier plate, and the first section is configured to support a respective one of the workpieces by contacting a central aperture extending through the respective one of the workpieces.

In another embodiment, a method is provided for simultaneously dry etching first and second sides of a plurality of workpieces within a plasma chamber. The method includes supporting the workpieces between first and second electrodes inside the plasma chamber with the first and second sides of each workpiece uncovered, generating a plasma within the plasma chamber, and simultaneously exposing the first and second sides of each of the workpieces to the plasma to perform the dry etching.

The fixture in accordance with the various embodiments of the invention permits both sides of multiple workpieces (e.g., disk drive platters) to be uniformly, anisotropically, and simultaneously plasma etched. The fixture is compatible with automation using pick and place robots and, in certain embodiments, an edge exclusion is either not required or is minimized in surface area. The fixture promotes a high process throughput because multiple workpieces can be treated with a single plasma process. The fixture can be used in a plasma treatment process, subsequent to imprint lithography, that removes residual resist material from thin regions of the imprinted etch mask. The fixture may be used in other types of plasma processes, such as controlled ashing of resist or removal of a different type of material, used to treat workpieces.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the embodiments of the invention.

FIG. 2 is a cross-sectional view taken generally along line 2-2 of FIG. 1.

FIG. 3 is an enlarged view of a portion of FIG. 2.

FIG. 4 is an enlarged view similar to FIG. 3 in which the fixture is depicted holding a workpiece.

DETAILED DESCRIPTION

Figure 1:
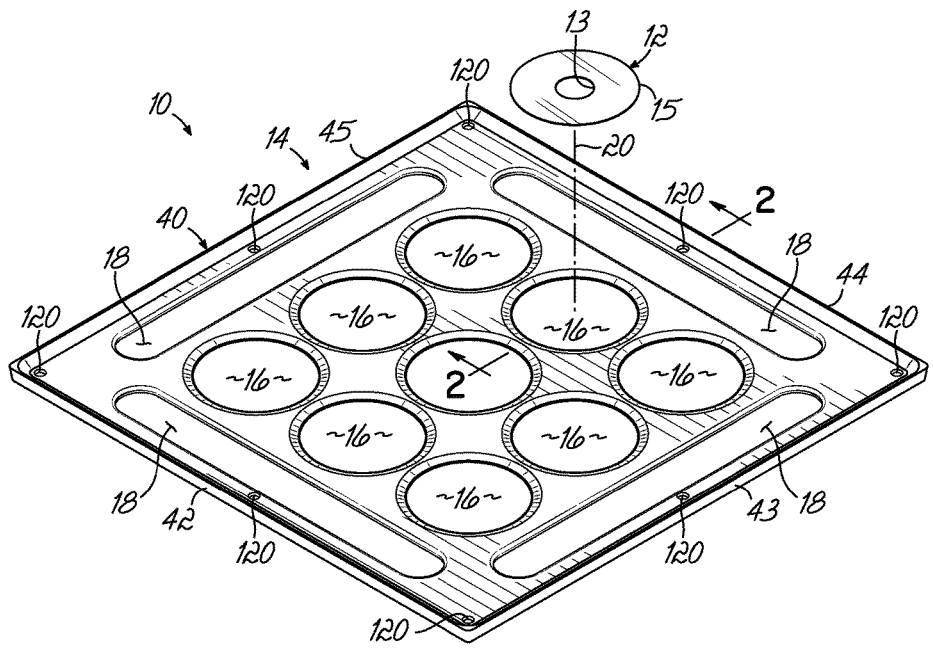
FIG. 1 is a top perspective view of a fixture for use in a plasma processing system.

With reference to FIGS. 1-4, a fixture 10 is configured to be cyclically loaded with a plurality of workpieces 12, positioned horizontally inside a plasma chamber of a plasma processing system, hold the workpieces 12 for exposure to a plasma, removed from the plasma chamber, and unloaded of plasma-processed workpieces 12. The fixture 10 includes a carrier tray or plate 14 having supports in the form of a plurality of openings 16 dimensioned and shaped for holding the workpieces 12 and one or more additional openings 18 of different dimensions and shape than openings 16. The openings 18 are not dimensioned and shaped to hold workpieces 12 and have a different function, as described below.

The openings 16 may be arranged in a square array, which in the representative embodiment is a three by three square array capable of supporting nine workpieces 12. In other embodiments, sixteen (e.g., in a four by four square array), twenty-five (e.g., in a five by five square array), or more openings 16 may be provided. A person having ordinary skill in the art will appreciate that the openings 16 may also have an asymmetrical arrangement. Openings 16, which are circular or round in the representative embodiment, have a smaller diameter than the workpieces 12, which are disk-shaped or round and relatively flat, and thin in the representative embodiment, that are disposed within the openings 16. In use, the openings 16 may be fully populated with workpieces 12 or may only be partially populated with workpieces 12.

The fixture 10 has particular utility in the manufacture of workpieces 12 in the form of magnetic data/information storage and retrieval media, e.g., hard disks. These workpieces 12 are typically disks or platters of a fixed outer diameter and each has a circular central aperture 13 that, when assembled and in use in a disk drive, is positioned on a motorized drive spindle. The majority of the radial extent of both sides of the platter from the inner peripheral edge of the central aperture 13 to the outer peripheral edge 15 of the workpiece 12 is dedicated for data storage and retrieval and, to that end, is coated with magnetic recording media. Each side of the workpiece 12 extends from the central aperture 13 to the outer peripheral edge 15. When the workpiece 12 is disposed in the opening 16, the opening 16 in the carrier plate 14 is occluded but for the central aperture 13.

Each of the openings 16 extends through the entire thickness of the carrier plate 14 from a planar upper or top face or surface 34 to a planar lower or bottom face or surface 38 and is centered about a longitudinal axis in the form of a centerline 20. An annular beveled surface 22 defined in the carrier plate 14 is inwardly and downwardly angled with a frustoconical shape from the planar top surface 34 toward the centerline 20 of the opening 16. As best shown in FIG. 3, the annular beveled surface 22 is interrupted by a groove, which includes an annular sidewall 24 and an annular lip 26 that meets the annular sidewall 24 at a corner 25. Annular sidewall 24 intersects the annular beveled surface 22 at a corner 28 and annular lip 26 intersects an inner peripheral rim 30 encircling the opening 16 at a corner 32. Annular sidewall 24, annular lip 26, annular beveled surface 22, and inner peripheral rim 30 are centered about the centerline 20 of the opening 16 and extend circumferentially about the opening 16. The annular lip 26 is inclined with a slope toward the centerline 20 at a different angle than the annular beveled surface 22. In the representative embodiment, the annular lip 26 consists of a flat or planar surface that is contained in a plane approximately parallel with a plane containing the top surface 34.

Each opening 16 is characterized by a radius, R, measured from the centerline 20 to the annular sidewall 24 that is slightly smaller than the diameter of the workpiece 12. The dimension and size, as well as the geometrical shape, of the openings 16 can vary according to the specification for the workpieces 12. The carrier plate 14 can be made from any appropriate solid, electrically-conductive type of material.

The annular beveled surface 22 operates to recess the annular sidewall 24 and annular lip 26 relative to the planar top surface 34 of the carrier plate 14. Annular lip 26 is configured to contact an annular region encircling the outer peripheral edge 15 of the workpiece 12 and annular sidewall 24 restricts the lateral movement of the workpiece 12 relative to the opening 16 when resting on annular lip 26, as best shown in FIG. 4. The inclined angling of the annular beveled surface 22 assists in loading the workpiece 12 into the opening 16 by directing the workpiece 12 toward the annular lip 26 while only contacting the outer edge of the workpiece 12. The annular sidewall 24 and annular lip 26 cooperate to provide a reproducible positioning of the workpiece 12 within the opening 16. The annular region of the workpiece 12 along the outer peripheral edge 15 that ultimately has the contacting relationship with the annular lip 26 is narrow in width, which permits the workpiece 12 to be supported over a minimal surface area. In one embodiment, the width of the annular lip 26 is approximately 0.5 mm and the depth of the annular sidewall 24 is likewise approximately 0.5 mm. When disposed inside the plasma chamber, the carrier plate 14 is oriented such that the annular beveled surface 22 faces upwardly, each workpiece 12 rests on the annular lip 26 ringing one of the openings 16, and each annular lip 26 supports the weight of the workpiece 12.

About each opening 16, another annular beveled surface 36 is inwardly and downwardly angled relative to the planar bottom surface 38 of the carrier plate 14 toward the centerline 20. The annular beveled surface 36, which has a frustoconical shape, extends circumferentially about the opening 16. As a consequence, the carrier plate 14 is also recessed by the annular beveled surface 36 about each opening 12 relative to the planar bottom surface 38. The planar top and bottom surfaces 34, 38 of the carrier plate 14 are contained in approximately parallel planes separated by the thickness of the carrier plate 14. The annular beveled surface 36 merges with the inner peripheral rim 30 proximate to annular lip 26 and the annular beveled surfaces 22, 36 cooperate to effectively thin the material of the carrier plate 14 with decreasing distance from the centerline 20. The tapering provided by the annular beveled surfaces 22, 36 is believed to aid in promoting plasma uniformity over the opposite front and rear surfaces of the workpieces 12.

Figure 6:
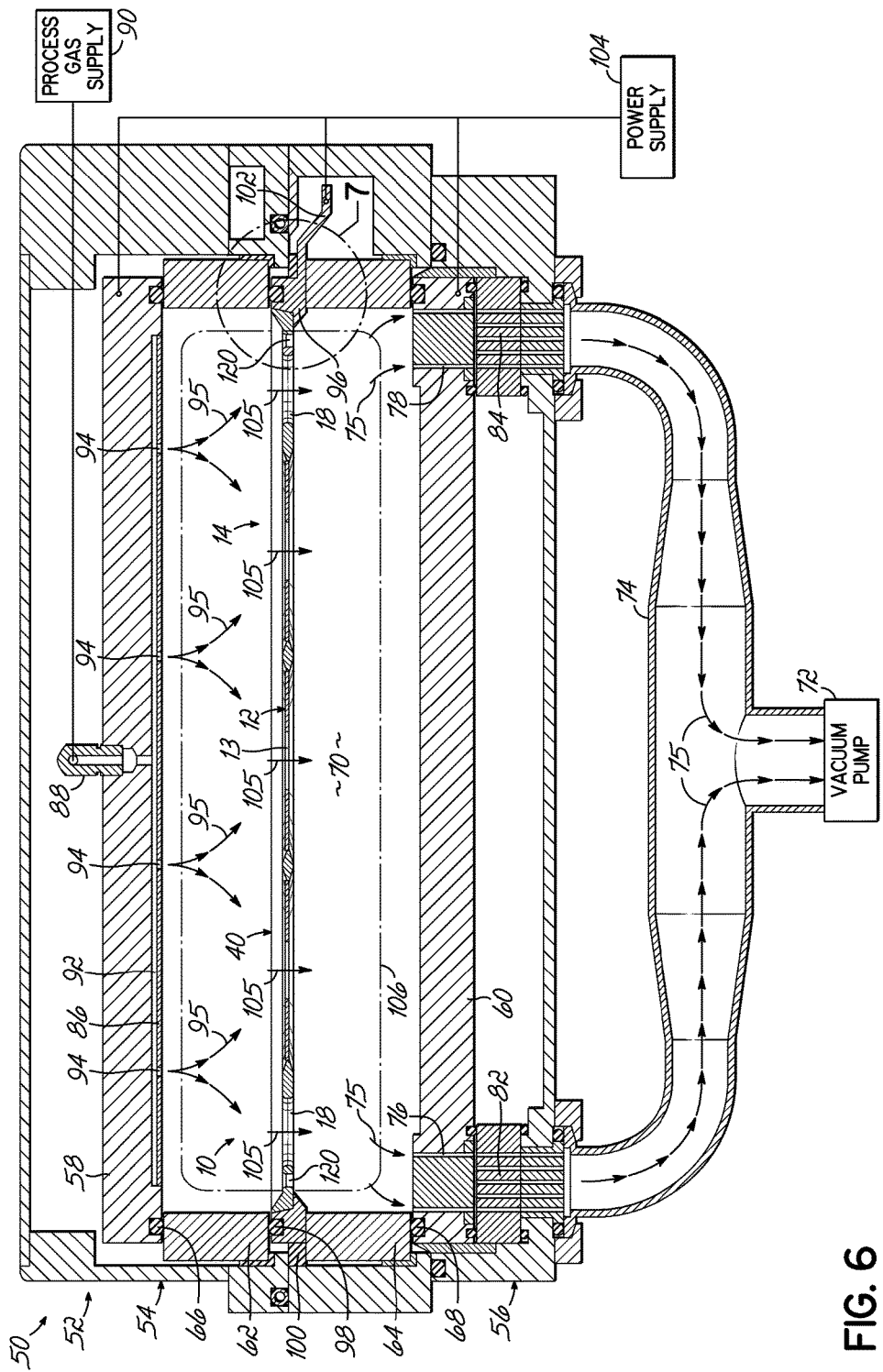
FIG. 6 is a cross-sectional view of the fixture of FIG. 1 disposed inside the plasma processing system.

Each of the openings 18 also extends through the entire thickness of the carrier plate 14 from planar top surface 34 to planar bottom surface 38. In the representative embodiment, the openings 18 are elongated slots with rounded ends, although the invention is not so limited. The openings 18 are peripherally arranged between openings 16 and an outer rim 40 of the carrier plate 14 that includes outwardly-facing exterior edges 42, 43, 44, 45. The outer rim 40 projects above a plane containing the planar top surface 34 so that the outer rim 40 and top surface 34 define a tray. The openings 18 are spatially distributed with a symmetrical arrangement about the carrier plate 14 such that one of the openings 18 is located between openings 16 and a respective one of the edges 42-45. As explained in greater detail below, the openings 18 provide an array of flow paths for process gas and plasma from one side 34 of the carrier plate 14 to the opposite side 38 of the carrier plate 14. Generally, the flow paths extend from side 34 to side 38 as the process gas enters from above the horizontally oriented carrier plate 14 and is exhausted below the carrier plate 14, as described below for an exemplary plasma processing system 50 (FIG. 6).

Each of the exterior edges 42, 43, 44, 45 is beveled relative to the planar bottom surface 38 such that the included angle, θ, between surface 38 and the outer rim 40 is an obtuse angle (i.e., greater than 90°). A person having ordinary skill in the art will appreciate that fewer than all of the exterior edges 42, 43, 44, 45 can be beveled so long as the exterior edges 42, 43, 44, 45 cooperate with the support frame 96 (FIGS. 6, 7) as described hereinafter.

Holes 120 are disposed peripherally about the outer rim 40 of the carrier plate 14. These holes 120 represent locations configured to be engaged by a pick and place robot or other automation for moving the carrier plate 14 and may be used, for example, to transfer the fixture 10 and workpieces 12 loaded into the openings 16 of the fixture 10 to and from the plasma chamber.

Figure 5:
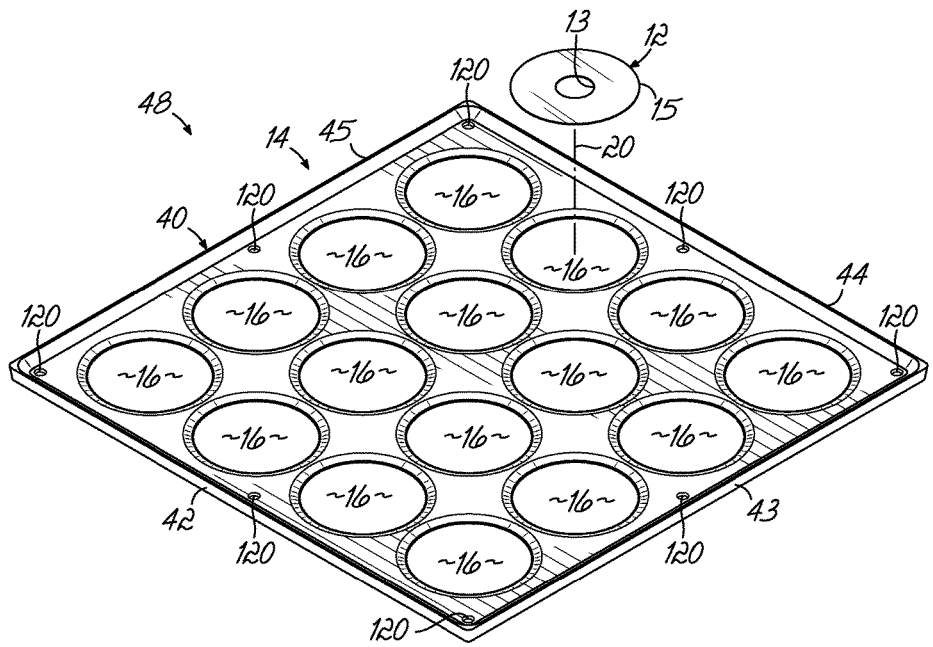
FIG. 5 is a top perspective view of a fixture in accordance with an alternative embodiment and for use in a plasma processing system.

With reference to FIG. 5 in which like reference numerals refer to like features in FIGS. 1-4 and in accordance with an alternative embodiment, a fixture 48 includes openings 16 but omits the openings 18. Because of the increase in the surface area available for openings 16, the number of openings 16 can be increased. This increases the capacity of the fixture 48 in comparison with fixture 10 (FIGS. 1-4) but constrains the flow paths for process gas and plasma from one side 34 of the carrier plate 14 to the opposite side 38 of the carrier plate 14 to the open space defined by the central aperture 13 in each of the workpieces 12.

Figure 7:
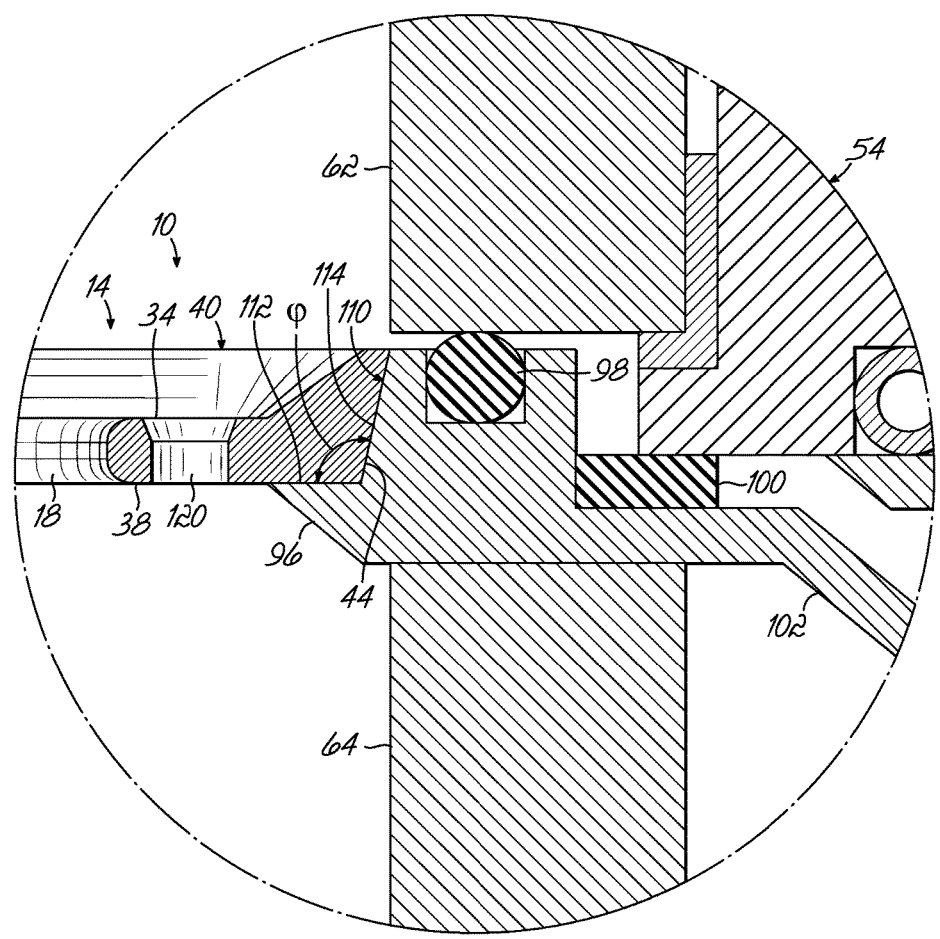
FIG. 7 is an enlarged view of a portion of FIG. 6.

With reference to FIGS. 6 and 7, a plasma processing system 50 generally includes an enclosure 52 having a lid 54 and a base 56 upon which the lid 54 rests, an upper electrode 58, a lower electrode 60, and a pair of separating rings 62, 64 disposed between the upper and lower electrodes 58, 60. Sealing members 66, 68 provide vacuum seals respectively compressed between the upper and lower electrodes 58, 60 and the separating rings 62, 64 such that the interior of the enclosure 52 defines a processing space 70 that is isolated from the atmospheric pressure environment of the plasma processing system 50 and the assembly defines a plasma chamber in which an environment can be supplied to generate a plasma.

A vacuum pump 72 is coupled by a vacuum manifold 74 with ports 76, 78 extending through the lower electrode 60. The vacuum pump 72 is configured to evacuate volatile byproducts generated by the plasma process transpiring in processing space 70 and spent process gas from the processing space 70, as indicated by arrows 75. The vacuum pump 72 is operative to maintain the vacuum pressure in the processing space 70 sufficiently low to permit plasma formation. Typically pressures suitable for plasma formation range from about twenty (20) millitorr to greater than about fifty (50) torr. The pressure within the processing space 70 is controlled in accordance with a particular desired plasma process and primarily consists of partial pressure contributions from the process gas, which may comprise one or more individual gas species, supplied to the evacuated processing space 70. Baffles 82, 84 are disposed in the ports 76, 78 to prevent plasma excitation in the vacuum manifold 74 so that the plasma is confined to the processing space 70.

The plasma processing system 50 includes a gas showerhead 86 that is coupled with the upper electrode 58 and suspended above the lower electrode 60. Extending through the upper electrode 58 is a gas port 88 that couples a process gas supply 90 with a gas distribution space 92 between the gas showerhead 86 and the upper electrode 58. The gas showerhead 86 includes a plurality of passages 94 that communicate process gas, as diagrammatically shown by single headed arrows 95, from the gas distribution space 92 into the processing space 70. The flow of process gas from the gas showerhead 86 into the processing space 70 and the pumping rate of vacuum pump 72 are coordinated to maintain the total gas pressure in the processing space 70 at a level low enough to promote plasma formation from the partial pressure of process gas.

A support frame 96 is disposed between the separating rings 62, 64 and extends circumferentially about the processing space 70. Sealing members 98, 100 provide vacuum seals for the support frame 96 with the separating rings 62, 64. The support frame 96 is configured to support the fixture 10 (or alternatively fixture 48) inside the processing space 70 at a location between the upper and lower electrodes 58, 60. The openings 16 in the fixture 10 are populated with workpieces 12 when placed upon the support frame 96. When the processing space 70 is evacuated and process gas is injected through the passages 94 in the gas showerhead 86, process gas flows through the openings 18 and through the central aperture 13 in each of the workpieces 12, as indicated by single headed arrows 105 for evacuation through the ports 76, 78 to the vacuum pump 72. In one embodiment, the openings 16, 18 have a symmetrical arrangement about the center of the carrier plate, which is believed to optimize the distribution of process gas flow through the openings 16, 18 and therefore plasma uniformity, especially by promoting uniform process gas distribution on the bottom side 38 of the carrier plate 14.

The support frame 96 includes a groove 110 that is located inside of the processing space 70 and that extends circumferentially about the processing space 70. The groove 110 includes a first surface 112 and a second surface 114 that intersects the first surface 112 to define an interior angle, φ, greater than 90°. The interior angle, φ, is approximately equal to or slightly smaller than the included angle, θ, between surface 38 and the outer rim 40. When the carrier plate 14 is supported on the support frame 96, the bottom surface 38 of the carrier plate 14 has a contacting relationship with the first surface 112 and each of the exterior edges 42, 43, 44, 45 of the carrier plate 14 has a contacting or confronting relationship with the second surface 114 so as to provide reproducible positioning of the carrier plate 14 inside the plasma chamber. When supported on the support frame 96, the carrier plate 14 has a horizontal orientation so that gravity pulls each workpiece 12 into contact with the respective annular lip 26 extending circumferentially about each opening 16. The carrier plate 14 lacks any type of clip or other mechanical structure or restraint for securing the workpiece 12 inside the opening 16.

As best shown in FIG. 7, a tab 102 extends outwardly from the support frame 96 and is accessible exterior of the processing space 70 for electrically contacting the support frame 96. A power supply 104 is coupled with the tab 102 and with the upper and lower electrodes 58, 60 by shielded coaxial cables or transmission lines. The power supply 104 may be operated at one or more radio frequencies and may include an impedance matching network (not shown) that measures reflected power from the load represented by the upper and lower electrodes 58, 60, the support frame 96, fixture 10, and workpieces 12, and the plasma 106 inside the processing space 70 back to the power supply 104. The impendence matching network, which as a construction understood by a person of ordinary skill in the art, is configured to adjust the impedance to minimize the reflected power. The power and voltage levels and the operating frequency of the power supply 104 may vary depending upon the particular application.

During processing of the workpieces 12, the power supplied from the power supply 104 to the upper and lower electrodes 58, 60 and fixture 10 produces a time-varying electromagnetic field in the processing space 70. The electromagnetic field excites the process gas present in the processing space 70 to a plasma state. The plasma 106 is sustained by the continued application of power from power supply 104 for the duration of the plasma treatment. The upper and lower electrodes 58, 60 and fixture 10 may be powered in various different manners. As examples, the fixture 10 may be powered and the upper and lower electrodes 58, 60 may be grounded, the fixture 10 may be grounded and the upper and lower electrodes 58, 60 may be powered, or the fixture 10 may be floating and the upper and lower electrodes 58, 60 may be powered.

Constituent components of the plasma (radicals, etc.) generated from the process gas interact with exposed material, such as magnetic recording media, on both sides of the workpieces 12 to perform the desired surface modification. The plasma is configured to perform the desired surface modification by selecting parameters such as the chemistry of the process gas, the pressure inside the processing space 70, and the amount of power and/or frequency applied to the upper and lower electrodes 58, 60 and fixture 10. In one embodiment, a plasma formed from a gas mixture of oxygen and argon, primarily argon, may be used to simultaneously plasma treat both sides of the workpieces 12. The processing system 50 may include an end point recognition system (not shown) that automatically recognizes when a plasma process (e.g., an etching process) has reached a predetermined end point or, alternatively, plasma processes may be timed based upon an empirically-determined process time.

Figure 8:
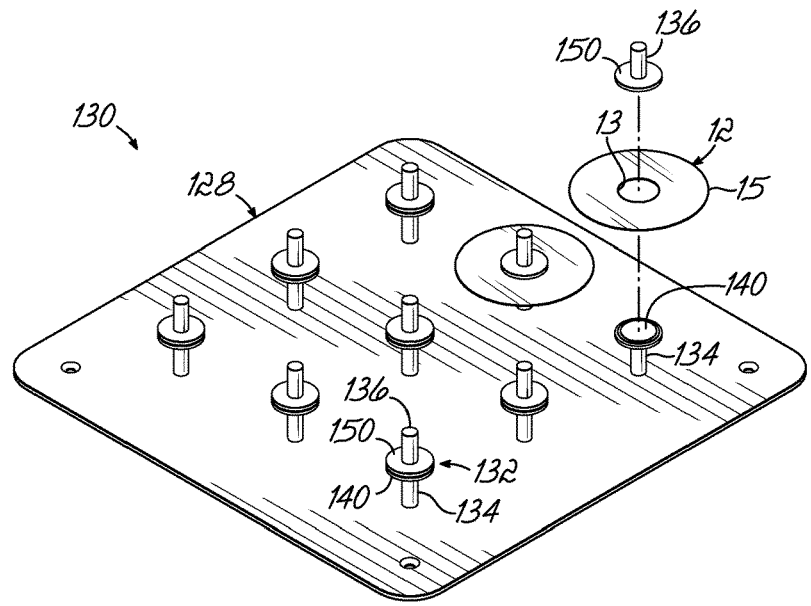
FIG. 8 is a top perspective view of a fixture in accordance with an alternative embodiment and for use in a plasma processing system.
Figure 10:
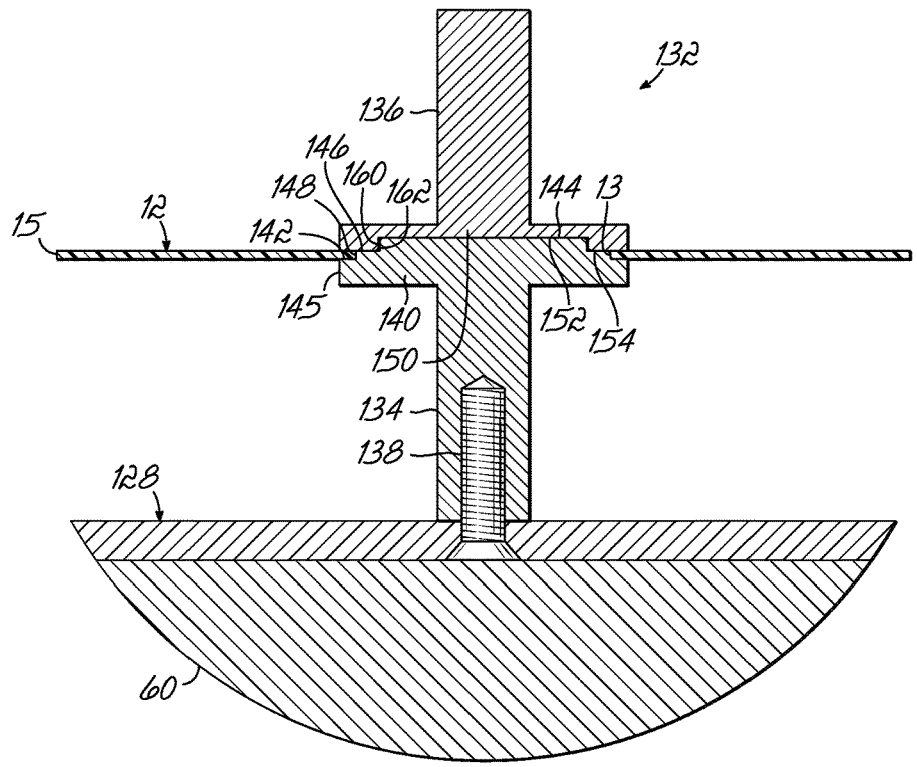
FIG. 10 is an enlarged view of a portion of FIG. 9.
Figure 9:
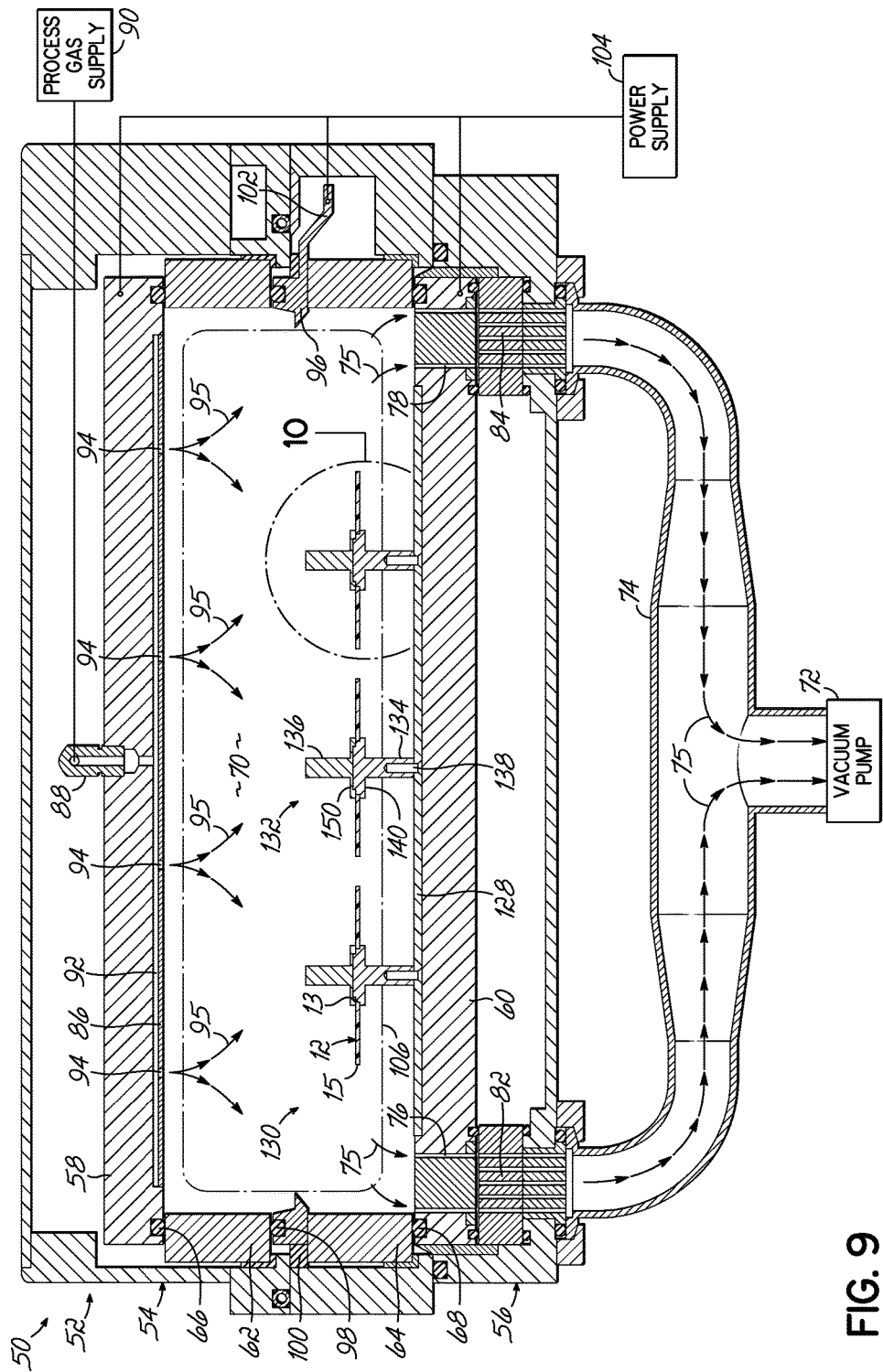
FIG. 9 is a cross-sectional view similar to FIG. 6 showing the fixture of FIG. 8 disposed inside the plasma processing system.

With reference to FIGS. 8-10 in which like reference numerals refer to like features in FIGS. 1-7 and in accordance with an alternative embodiment, a fixture 130 includes a carrier plate 148 and supports in the form of a plurality of pedestals or posts 132 that are configured to hold and support the workpieces 12 inside the processing space 70. Each of the posts 132 includes a lower section 134 secured by a fastener 138 with the carrier plate 148 and an upper section 136 coupled with the lower section 134. The carrier plate 148, when secured with the lower electrode 60 to form an assembly with good electrical contact between the carrier plate 148 and the lower electrode 60, is powered when the lower electrode 60 is powered.

The lower section 134 of each post 132 is capped by a disk-shaped or round flange 140 with a recessed annular surface 142 at its peripheral edge, a round raised central surface 144, and a recessed annular surface 146 radially between the raised central surface 144 and the recessed annular surface 142. The flange 140 has an outer rim 145 and the recessed annular surface 142 defines a corner at the intersection with the outer rim 145. The recessed annular surface 146 is recessed relative to the round raised central surface 144 and is raised relative to the recessed annular surface 142 to define a sidewall 160 of the round raised central surface 144.

The upper section 136 is capped by a disk-shaped or round flange 150 with a round recessed central surface 152 and a raised annular surface 154 that encircles the recessed central surface 152. The raised annular surface 154 is raised relative to the round recessed central surface 152 to define a cup-shaped structure with the round recessed central surface 152 bounded by a sidewall 162 of the raised annular surface 154. By its presence, the upper section 136, which is a mirror image exteriorly of the lower section 134 in the representative embodiment, may improve etch uniformity by reducing the perturbences in the process gas flow about the lower section 134.

The workpiece 12 rests in a contacted relationship with the recessed annular surface 142 of flange 140 over a small annular region surrounding the central aperture 13. This annular region of the workpiece 12 is disposed between the recessed annular surface 142 of flange 140 and the raised annular outer surface 154 of flange 150. An outer diameter of the recessed annular surface 146 is approximately equal to a diameter of the central aperture 13 in the workpiece 12. The height difference between the recessed annular surfaces 142, 146 provides an annular sidewall 148 radially inside the central aperture 13 that restricts the range of lateral movement of the workpiece 12 relative to the flanges 140, 150.

The posts 132 are distributed across the surface area of the carrier plate 148 such that the workpieces 12 have a non-contacting relationship with each other. The arrangement of the posts 132 may be similar to the arrangement of the openings 16 (FIGS. 1-5). The lower and upper sections 134, 136 are assembled during use such that the workpiece 12 is secured between the flanges 140, 150 and the projection of the round raised central surface 144 of flange 140 into the recess bounded by the raised annular outer surface 154 of flange 150 into contact with the round recessed central surface 152 so that the sidewalls 160, 162 secure the upper section 136 against unintentional lateral movement relative to the lower section 134.

To populate the posts 132 with workpieces 12, a transfer tray similar to fixture 10 (FIGS. 1-6) may be used by a pick and place robot or other automation to transfer the workpieces 12 from a location external to the vacuum chamber to a location overlying the post 132. The openings in the transfer tray would be registerable with the positions of the posts 132. As the transfer tray is lowered, the workpieces 12 are transferred to the lower sections 134 of the posts 132. After the transfer is perfected, the transfer tray is lowered onto the lower electrode 60 and remains in this position during the plasma treatment. The upper sections 136 may be mounted atop the respective lower sections 134 by a pick and place robot. The transfer process is reversed to remove the processed workpieces 12 from the posts 132 and the plasma chamber.

In comparison with fixtures 10, 48 (FIGS. 1-7), the posts 132 of fixture 130 suspend the workpieces 12 directly above the lower electrode 60 without the need for additional structure like openings in a carrier plate. As a result, the flow of process gas through the processing space 70 from the gas showerhead 86 to the ports 76, 78 is not obstructed. The height at which the workpieces 12 are suspended above the plane of the carrier plate 148 is determined primarily by the height of the lower section 134 of each post 132. Because the workpieces 12 are supported by the circular central aperture 13 and not along the outer peripheral edge 15, the workpieces 12 are processed completed to the outer peripheral edge 15, which increases the processed surface area and is compatible with workpieces 12 that lack an outer edge exclusion area. In addition, the portion of the workpiece 12 surrounding the central aperture 13 is typically not used data storage and, instead, is used to interface with the motorized drive spindle in a disk drive.

In one embodiment, the posts 132 are composed of a conductor such that the posts 132 represented powered pedestals when the lower electrode 60 is energized, which promotes an anisotropic dry etch process. In comparison with schemes that support the workpieces 12 by an outer edge, which may be resist covered and therefore slightly electrically insulating, supporting the workpieces 12 by contact about the center aperture 13 may provide a superior electrical contact with the workpieces 12. In another embodiment, the posts 132 may be composed of an electrical insulator such that the workpieces 12 are electrically floating and which promotes an isotropic dry etch process.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims.

What is claimed is:

1. An apparatus for use in supporting a plurality of workpieces each having first and second sides and an outer peripheral edge having an annular region inside a plasma chamber having a processing space, the apparatus comprising:
   an upper electrode;
   a lower electrode positioned with respect to said upper electrode to define a processing space therebetween;
   a support frame fixed between and spaced apart from said upper electrode and said lower electrode, said support frame including a first surface and a second surface that intersects and is angularly offset with respect to the first surface, wherein the first and second surfaces define a groove;
   a fixture configured to be supported by said support frame inside said processing space, said fixture including a horizontally-oriented carrier plate having a thickness and comprising:
      an outer rim that seats in said groove of said support frame to position said carrier plate between said upper electrode and said lower electrode, such that, a first portion of said processing space extends from said carrier plate to the said upper electrode and a second portion of said processing space extends from said carrier plate to said lower electrode;
      a planar top surface;
      a planar bottom surface; and
      a plurality of first openings extending through the thickness of said carrier plate from said planar top surface to said planar bottom surface, each of said plurality of first openings having a centerline that is parallel to the thickness of said carrier plate, within each of said plurality of first openings is a first beveled annular surface that is inwardly and downwardly angled from said planar top surface towards said centerline, a second beveled annular surface that is inwardly angled from said planar bottom surface towards said centerline, and an annular groove having an annular sidewall and an annular lip, said annular sidewall and said annular lip extending circumferentially about said first beveled annular surface,
   wherein each of said annular grooves is configured to contact said annular region at said outer peripheral edge of one of the workpieces so that substantially all of the first and second sides of each of the workpieces are positioned to be simultaneously exposed to the plasma when the workpieces are seated in the respective annular groove.

2. The apparatus of claim 1 wherein said carrier plate includes one or more second openings extending through the thickness of said carrier plate, said one or more second openings configured to pass a process gas used to generate the plasma.

3. The apparatus of claim 1 wherein said carrier plate includes an outer rim extending about said planar top surface and raised relative to said planar top surface, and said outer rim includes one or more exterior edges beveled relative to said planar bottom surface with an included angle greater than 90°.

4. The apparatus of claim 1 wherein said annular groove is separated from said planar top surface by said first annular beveled surface.

5. The apparatus of claim 1, wherein each of said plurality of first openings is round.

6. The apparatus of claim 1, wherein each of said first beveled annular surfaces is frustoconical and each of said second beveled annular surfaces is frustoconical.

7. The apparatus of claim 1 wherein each annular groove is disposed between said first annular beveled surface and said second annular beveled surface.

8. The apparatus of claim 1, wherein each of said second beveled annular surfaces is downwardly angled relative to the planar bottom surface from the annular lip toward the planar bottom surface.

9. The apparatus of claim 1 wherein the annular sidewall is parallel to and faces the centerline, and the annular lip intersects the annular sidewall, wherein the carrier plate includes an annular inner rim that defines a minimum cross-sectional dimension of the first opening, wherein the annular lip extends from the annular sidewall to the annular inner rim.

* * * * *